(12) United States Patent
Weidenfelder et al.

(10) Patent No.: US 12,504,335 B2
(45) Date of Patent: Dec. 23, 2025

(54) SENSOR ELEMENT AND METHOD FOR MANUFACTURING A SENSOR ELEMENT

(71) Applicant: TDK Electronics AG, Munich (DE)

(72) Inventors: Anke Weidenfelder, Graz (AT); Jan Ihle, Raaba-Grambach (AT); Thomas Stendel, Berlin (DE); Lutz Heiner Kirsten, Deutschlandsburg (AT)

(73) Assignee: TDK Electronics AG, Munich (DE)

( * ) Notice: Subject to any disclaimer, the term of this patent is extended or adjusted under 35 U.S.C. 154(b) by 456 days.

(21) Appl. No.: 17/637,768

(22) PCT Filed: Sep. 16, 2020

(86) PCT No.: PCT/EP2020/075850
§ 371 (c)(1),
(2) Date: Feb. 23, 2022

(87) PCT Pub. No.: WO2021/099004
PCT Pub. Date: May 27, 2021

(65) Prior Publication Data
US 2022/0283040 A1    Sep. 8, 2022

(30) Foreign Application Priority Data
Nov. 20, 2019    (DE) .......................... 102019131306.6

(51) Int. Cl.
*G01K 7/22*    (2006.01)
*H01C 7/04*    (2006.01)
*H05K 1/18*    (2006.01)

(52) U.S. Cl.
CPC ............... *G01K 7/22* (2013.01); *H01C 7/041* (2013.01); *H05K 1/181* (2013.01); *H05K 2201/10022* (2013.01); *H05K 2201/10151* (2013.01)

(58) Field of Classification Search
CPC .......... G01K 7/22; H01C 7/041; H01C 1/012; H01C 1/14; H01C 7/04; H05K 1/181; H05K 2201/10022; H05K 2201/10151; H05K 1/0306; H05K 1/141; H05K 2201/049; H05K 2203/049
See application file for complete search history.

(56) References Cited

U.S. PATENT DOCUMENTS 7,746,658 B2    6/2010    Saito
8,373,535 B2    2/2013    Lavenuta
(Continued)

FOREIGN PATENT DOCUMENTS

CN    101399263 A    4/2009
CN    202886007 U    4/2013
(Continued)

*Primary Examiner* — John E Breene
*Assistant Examiner* — Janice M Soto
(74) *Attorney, Agent, or Firm* — Slater Matsil, LLP

(57) ABSTRACT

In an embodiment a sensor element includes a carrier having an electrically insulating material, a top side and a bottom side, an NTC thermistor arranged on the top side of the carrier and at least two first electrodes configured for electrically contacting the sensor element, wherein the first electrodes are arranged on the top side of the carrier, wherein the sensor element is configured to measure a temperature, and wherein the sensor element is configured for direct integration in an electrically insulating manner.

23 Claims, 2 Drawing Sheets

(56) References Cited

U.S. PATENT DOCUMENTS

| | | | |
|---|---|---|---|
| 10,056,175 | B2 | 8/2018 | Yamamoto et al. |
| 10,861,624 | B2 | 12/2020 | Strallhofer et al. |
| 10,908,030 | B2 | 2/2021 | Ihle et al. |
| 2002/0101327 | A1 | 8/2002 | Lavenuta |
| 2014/0079094 | A1 | 3/2014 | Kim |
| 2015/0185087 | A1 | 7/2015 | Ogoshi et al. |
| 2017/0162303 | A1* | 6/2017 | Strallhofer ........... H01C 17/288 |
| 2017/0271056 | A1* | 9/2017 | Hirata .................... H01C 1/142 |
| 2018/0122537 | A1 | 5/2018 | Sentoku et al. |

FOREIGN PATENT DOCUMENTS

| | | | |
|---|---|---|---|
| DE | 102014110553 A1 | 1/2016 | |
| DE | 102016101249 A1 * | 5/2017 | ........... B28B 11/243 |
| DE | 102018203971 A1 | 9/2019 | |
| EP | 1227308 A1 | 7/2002 | |
| JP | H05135849 A | 6/1993 | |
| JP | H05175006 A | 7/1993 | |
| JP | 2000266608 A | 9/2000 | |
| JP | 2011044621 A | 3/2011 | |
| JP | 2018535412 A | 11/2018 | |
| KR | 20100037802 A | 4/2010 | |

* cited by examiner

SENSOR ELEMENT AND METHOD FOR MANUFACTURING A SENSOR ELEMENT

This patent application is a national phase filing under section 371 of PCT/EP2020/075850, filed Sep. 16, 2020, which claims the priority of German patent application 102019131306.6, filed Nov. 20, 2019, each of which is incorporated herein by reference in its entirety.

TECHNICAL FIELD

The present invention relates to a sensor element, in particular a temperature sensor. The present invention further relates to a method for manufacturing a sensor element, preferably a temperature sensor.

BACKGROUND

According to the state of the art, temperatures for monitoring and control in a wide variety of applications are predominantly measured using ceramic thermoconductor thermistor elements ("Negative Temperature Coefficient"; NTC), silicon temperature sensors (KTY), platinum temperature sensors (PRTD) or thermocouples (TC). NTC thermistors are the most widely used because of their low manufacturing costs.

Another advantage of NTC thermistors over thermocouples and metallic resistive elements, such as Pt elements, is their distinct negative resistance-temperature characteristic.

For use in power modules, SMD ("surface mounted device") NTC temperature sensors, which are soldered on, are predominantly used. Alternatively, for low power control modules, NTC chips are used which are mounted on the bottom side by means of Ag sintering paste, soldering or gluing and the top side is contacted by a bonding wire.

For electrical contacting of the NTC ceramics, metallic electrodes must be applied. According to the state of the art, thick-film electrodes mainly made of silver or gold pastes are applied for this purpose via a screen-printing process with subsequent firing.

Silver metallizations are particularly suitable for soldered joints. Due to the increasing technological requirements with regard to new reliable connection contacts such as bonding and welding, a different electrode is required especially for bonding with gold or aluminium or copper wires, since a connection to silver does not provide sufficient reliability.

In the case of gold metallization, solder connections to lead wires cannot be realized. Bond connections are only realized with gold thin wire for cost reasons. Aluminium bond wire connections on thick film gold electrodes do not achieve the reliability requirements.

Sintering under pressure at low temperatures with finely dispersed silver pastes is furthermore not practical in the case of gold electrodes due to insufficient adhesion strength and insufficient reliability.

At present, temperature measurement in power modules with soldered-on sensors is carried out on separate conductive paths. The positioning on the printed circuit board is in a separate area of the power module at the edge or in the intermediate area of the power semiconductors. Accurate temperature measurement is therefore only possible to a very limited extent, since there is only an indirect thermal connection via the ceramic substrate.

However, due to the increasing requirements in terms of operating temperature and reliability, there is a demand for NTC temperature sensors that can preferably be applied directly to the circuit board tracks.

SUMMARY

Embodiments provide a sensor element and a method for manufacturing a sensor element which solve the above problems.

According to one embodiment, a sensor element is described. The sensor element is configured to measure a temperature. The sensor element is a temperature sensor. The sensor element is configured for measuring temperature in power modules.

The sensor element has a carrier or a substrate. The carrier is electrically insulating. In particular, the carrier has an electrically insulating material. The carrier has a material with a high thermal conductivity. Preferably, the carrier has a ceramic material. The carrier is a ceramic carrier.

The carrier has a top side and a bottom side. The top side and the bottom side are opposite to each other. The bottom side is that side of the carrier or of the sensor element which faces a printed circuit board in the installed state of the sensor element.

The sensor element also has an NTC thermistor. The NTC thermistor is arranged on the top side of the carrier. In a first embodiment, the NTC thermistor is an SMD NTC thermistor. In a second embodiment, the NTC thermistor is a chip NTC thermistor. The NTC thermistor has a top side and a bottom side. The top and bottom sides are opposite each other. The top side is the side of the NTC thermistor that faces away from the carrier in the installed state of the sensor element.

The sensor element has at least two first or upper electrodes. In particular, the sensor element has a first upper electrode. The sensor element further comprises a second upper electrode.

The first/upper electrodes are configured for electrically contacting the sensor element and/or the NTC thermistor. The first/upper electrodes are arranged on the top side of the carrier. The first/upper electrodes are formed spatially and electrically separated from each other on the surface of the carrier. The first electrodes are formed in a structured manner.

The sensor element has at least one second/lower electrode, preferably exactly one second electrode. The second/lower electrode is a pure metallization and has no electrical function. The second electrode is arranged or formed on the bottom side of the carrier. Preferably, the second electrode is formed over the entire surface. In other words, the second electrode completely covers the bottom side. The second electrode can also be formed and arranged such that a free edge is formed on the bottom side of the carrier. In this case, the second electrode does not extend to the edge of the bottom side of the carrier.

The sensor element is designed to be integrated directly in an electrically insulating manner, for example on a conductor path of a power module. This ensures precise temperature monitoring at the desired position, since the thermal coupling to the IC (integrated circuit) is provided directly via the conductor path. This provides a very precise and reliable sensor element.

According to one embodiment, the material of the carrier has a ceramic based on $Al_2O_3$, LTCC ("Low Temperature Cofired Ceramics") or ZTA ("Zirconia Toughened Aluminium Oxide") materials. Alternatively, the carrier material may also comprise AlN or $Si_3N_4$. These materials increase the mechanical stability of the sensor element. This provides a particularly reliable sensor element.

According to one embodiment, the thermal expansion coefficients of the carrier material and a material of the NTC thermistor are matched to each other. Thus, damage to the junctions between the NTC thermistor and the carrier due to cyclic temperature changes and thermomechanical stresses occurring in the process can be avoided.

According to one embodiment, the first or upper electrodes are designed and arranged to enable electrical contacting of the sensor element using conventional AVT (assembly and connection technology). Preferably, the first electrodes are designed to be contactable by means of soldering and/or wire bonding (preferably thick wire bonding).

Furthermore, the second or lower electrode is designed and arranged to be applied directly to the conductor path of the power module using conventional AVT. Preferably, the second electrode is integrated on the conductor path by means of soldering or silver sintering.

This means that connection techniques are used which are standard in the manufacture of power modules. This enables the provision of a low-cost and simple sensor element.

According to an embodiment, the respective first or upper electrode has a plurality of layers. Preferably, the respective first electrode has at least two layers. Each layer may comprise a plurality of individual layers or sub-layers. Depending on the material, the layers are designed as thin or thick layers. Each layer of the respective first electrode has a specific material.

In the first variant (SMD NTC thermistor), the respective first electrode preferably has the materials Cu, Ni and Au. In the second variant (chip NTC thermistor), the first electrode of the carrier has the materials Cu, Ni, Pd and/or Au and the electrode on the chip NTC thermistor has the materials Ni and Au. Optionally, the respective first electrode may also comprise Pd.

For example, on the carrier, a bottom layer of the first electrode has Cu. In this case, the bottom layer is the layer of the first electrode that is formed directly or immediately on the top side of the carrier. For example, a middle layer has Ni. For example, a second or further middle layer has Pd. For example, a top layer comprises Au. The top layer forms the top side or outer side of the respective first electrode.

Preferably, at least one layer of the first electrode is formed as a thick film on the substrate. At least one further layer of the first electrode is further formed as a thin film. The Cu layer and the Ni layer are preferably formed as thick films. The Au layer and the Pd layer are preferably designed as thin films.

The layer thicknesses vary from ≤1 µm to ≤20 µm, whereby the Cu and Ni layers designed as thick films can each be up to 20 µm thick. The Pd and Au layers each have a thickness of ≤1 µm. The layer sequence and thickness are selected in such a way that, in particular, a reliable soldering and Al thick-wire bonding process is made possible.

Due to the special structure of the first or upper electrodes, contacting with Al thick wire, for example, is possible without damaging the NTC ceramic as well as with increased reliability compared to standard NTC thermistors.

According to an embodiment, the respective first or upper electrode has a first area for electrical contacting of the sensor element. Preferably, the electrical contacting is performed by wire bonding (preferably Al thick wire bonding) or soldering. The respective first electrode also has a second area for connecting or contacting the NTC thermistor. Preferably, the NTC thermistor is attached to the respective second area by soldering.

The first area and the second area are connected or linked to each other by a connecting area. The specific design or structuring of the respective first electrode enables the provision of a low-cost, stable and reliable sensor element.

According to an embodiment, (only) a first one of the two first/upper electrodes is formed directly on the top side of the carrier. For simplicity, the first of the two first/upper electrodes will hereinafter be referred to as the first upper electrode. The first upper electrode is analogous to the first electrodes described above. In particular, the first upper electrode is designed with multiple layers.

The first upper electrode represents a metallization of the ceramic carrier. In this embodiment, the NTC thermistor is a chip NTC thermistor (variant 2). The NTC thermistor is arranged directly or immediately on the first upper electrode, for example soldered, Ag-sintered or glued. The thickness of the NTC thermistor is preferably 0.2 mm to 0.7 mm. Preferably, the NTC thermistor has an area of $(1.25\pm0.75)$ mm×$(1.5\pm1.0)$ mm. Preferably, the chip NTC thermistor is located in an edge region of the first upper electrode. The area of the first upper electrode left free of the NTC thermistor serves as a (first) bond pad. This ensures electrical contacting of the NTC thermistor in a simple manner.

The first upper electrode can be implemented over the entire surface of the top side of the carrier. For example, the first upper electrode has an area of $(1.25\div0.75)$ mm× $(2.25\pm1.25)$ mm.

Alternatively, the first upper electrode may only partially cover the top side of the carrier. For example, a free edge is formed, i.e., an edge region of the top side which is free of the first upper electrode. For example, the free edge has a dimension of 0.1 mm to 0.25 mm.

According to an embodiment, the chip NTC thermistor has a metallization. The metallization is formed on the top side and on the bottom side of the NTC thermistor. The metallization is formed for electrical contacting of the sensor element, for example by wire bonding. The metallization acts as an electrode of the chip NTC thermistor.

Preferably, the metallization completely covers the top side of the chip NTC thermistor. The metallization of the chip NTC thermistor serves as another or second bond pad, for example, for Al thick wire bonding. In other words, the metallization forms a second of the two first/upper electrodes. For simplicity, the second of the two first/upper electrodes will be referred to herein as the second upper electrode. Thus, the metallized top side of the chip NTC thermistor acts as the second upper electrode of the sensor element. This ensures electrical contacting of the sensor element in a simple manner.

According to an embodiment, the metallization or the second upper electrode has at least one layer containing nickel. This layer is directly or immediately applied to a ceramic base body of the chip NTC thermistor. The layer may also consist of nickel. The thickness of the nickel-containing layer is in the range of 0.3 µm to 10 µm, for example. A nickel-containing layer allows particularly good mechanical and electrical bonding, especially to the ceramic of the NTC thermistor.

According to an embodiment, the layer additionally contains a proportion of vanadium. A proportion of vanadium can be advantageous for a sputtering process, in particular for process-related reasons. For example, vanadium is present in a weight fraction of 7% in the nickel-containing layer. For example, nickel is present in a weight fraction of 93%.

According to one embodiment, the metallization or the second upper electrode has at least one further layer containing Au. In other words, the layer structure of the second upper electrode is Ni/Au with Au as the uppermost electrode. The thickness of the Au layer is between 0.1 µm and 0.3 µm, ideally 0.2 µm.

In one embodiment, the metallization has at least one sputtered layer. For example, all layers are applied by sputtering. Preferably, the metallization is free of a baked-on paste. In the case of a sputtered metallization, one advantage is the lower thermal load on the sensor element in the manufacturing process, in particular by eliminating the need to burn in a metallization paste at temperatures of, for example, 700° C. to 900° C. Furthermore, a sputtering process permits particularly cost-effective manufacture.

For example, the metallization is a thin-film metallization. For example, the entire metallization has a thickness in the range from 0.3 µm to 10 µm.

According to one embodiment, the metallization has multiple layers arranged directly on top of each other. For example, the metallization has a bottom layer and a top layer. The bottom layer is preferably in direct contact with the ceramic of the base body. For example, the top layer is applied directly to the bottom layer. Preferably, both layers are sputtered. The metallization may also have more than two layers.

For example, the bottom layer contains chromium or consists of chromium. A chromium-containing layer can be particularly advantageous as an adhesion promoter to the ceramic. For example, the top layer contains nickel or consists of nickel. Additionally, the top layer may comprise a portion of vanadium.

According to an embodiment, the second or lower electrode or metallization is multi-layered. For example, the second electrode may have a layered structure which corresponds to the layered structure of the first electrode. The second electrode may comprise the materials Cu, Ni, Pd and/or Au. In this case, the second electrode may have a metallization on the top side or outer side to ensure silver sinterability of the sensor element.

Alternatively, however, the second electrode may have only one or more layers of another specific material. For example, the second electrode has at least one layer of the material Ag. This enables silver sinterability of the second electrode without additional layers (metallization). Thus, the structure of the sensor element is simplified.

According to an embodiment, the sensor element can also be designed without a second/lower electrode. This represents a simplification of the structure. In this case, the sensor element is intended for assembly with an adhesive process.

According to an embodiment, the sensor element has at least one adhesion promoting layer, for example a Ti layer. The adhesion promoting layer may be formed between the respective first electrode and the carrier, in particular the top side of the carrier. Alternatively or additionally, the adhesion promoting layer may be formed between the second electrode and the carrier, in particular the bottom side of the carrier. This increases the reliability of the bonding of the electrodes to the carrier material.

According to an embodiment, the sensor element comprises at least one protective layer or protective sheath. The protective layer is formed at least around the NTC thermistor. In this case, the NTC thermistor is an SMD NTC thermistor. Preferably, the protective layer completely envelops the NTC thermistor. The protective layer may comprise an epoxy resin. The protective layer may be formed as a glob top. The protective layer serves to increase the reliability and lifetime of the sensor element in a simple manner.

According to a further embodiment, a method for manufacturing a sensor element is described. Preferably, the method produces the sensor element described above. Any features disclosed with respect to the sensor element or the method are also disclosed correspondingly with respect to the respective other embodiment, and vice versa, even if the respective feature is not explicitly mentioned in the context of the respective embodiment. The method comprises the following steps, the order of the steps not being determined by the following list:

A) Providing a carrier material for forming the carrier. The carrier material is electrically insulating. The carrier material has a high thermal conductivity. The carrier material has a ceramic material. Preferably, the carrier material has a ceramic based on $Al_2O_3$, LTCC or ZTA materials. Alternatively, the carrier material may also comprise AlN or $Si_3N_4$.

B) Applying at least two first or upper electrodes on a top side of the carrier material. The first electrodes are formed in a structured manner. The first electrodes are multi-layered. The first electrodes are applied to the top side of the carrier material by a combined process of sputtering, chemical vapor deposition (CVD) process, physical vapor deposition (PVD) process, and/or electrodeposition.

In particular, the deposition of the multilayer electrodes is performed by a combination of different deposition processes to produce both thick and thin films. In addition, a lithography process is required to pattern the metallization. In particular, the process sequence for depositing the at least two first or upper electrodes on the top side of the carrier material is as follows:

a.: Wet chemical cleaning;
b.1: Sputtering Ti (this can be done simultaneously or one after the other for top and bottom side depending on the equipment);
b.2: Sputtering Cu (depending on the equipment, this can be done for top and bottom side at the same time or one after the other);
c.1: Laminating;
c.2: Exposure;
c.c3: Developing (step 1 of lithography);
d.: Cu electroplating (simultaneous for bottom and top side);
e.: Stripping (remove varnish—step 2 of lithography);
f.: Electroless nickel immersion gold (ENIG):
f.1: Cleaning;
f.2: Catalysis with Pd;
f.3: Electroless nickel deposition (wet chemical);
f.4: Immersion gold (also referred to as brew gold, diving gold, or flash gold).

The resulting first electrodes have a plurality of thick films and thin films of different materials. For example, the first electrodes have Cu, Ni, Pd, and/or Au.

C) Applying at least one second or lower electrode on a bottom side of the carrier material. The second electrode may be formed as a thin film or a thick film. For example, the second electrode is formed by sputtering. Alternatively, the second electrode may be deposited on the bottom side of the carrier material by a combined process of sputtering, CVD process, PVD process, and/or electrodeposition. In this case, the second electrode has a layered structure of different materials.

In particular, as already described in connection with the multilayer upper electrode, the multilayer electrode is deposited by a combination of different deposition processes to produce both thick and thin layers. In addition, a lithography process is required to pattern the metallization. In particular, the process sequence for depositing the at least (second/bottom) metallization on the bottom side of the carrier material is as follows:

a.: Wet chemical cleaning;
b.1: Sputtering Ti (this can be done simultaneously or one after the other for top and bottom side depending on the equipment);
b.2: Sputtering Cu (depending on the equipment, this can be done for top and bottom side at the same time or one after the other);
c.1: Laminating;
c.2: Exposure;
c.c3: Developing (step 1 of lithography);
d.: Cu electroplating (simultaneous for bottom and top side);
e.: Stripping (remove varnish—step 2 of lithography);
f.: Electroless nickel immersion gold:
f.1: Cleaning;
f.2: Catalysis with Pd;
f.3: Electroless nickel deposition (wet chemical);
f.4: Immersion gold (also referred to as brew gold, diving gold, or flash gold).

In a further step, a metallization can be applied to the bottom side of the second electrode. This metallization can be created by a CVD process, a PVD process, or by electrodeposition.

D) Arranging an NTC thermistor (SMD NTC thermistor) on the top side of the carrier material. The NTC thermistor is applied, preferably soldered, to a partial area of the at least two first electrodes.

Now the sensor element has all the properties to enable direct bonding of the sensor element to a conductor path of a printed circuit board. This is done by soldering or Ag-sintering the second electrode. Furthermore, those of the first electrodes and/or the NTC thermistor can also be electrically contacted, in particular by means of wire bonding and/or soldering.

The sensor element is characterized in particular by the fact that it can be integrated directly onto the conductor path of a power module. Due to the special structure of the electrodes, the sensor element can be processed using conventional AVT, such as soldering, silver sintering and/or (thick/thin) wire bonding. As a result, a particularly accurate, reliable and cost-effective sensor element is produced.

According to a further embodiment, a method for manufacturing a sensor element is described. Preferably, the method produces the sensor element described above. Any features disclosed with respect to the sensor element or the method are also disclosed correspondingly with respect to the respective other embodiment, and vice versa, even if the respective feature is not explicitly mentioned in the context of the respective embodiment. The method comprises the following steps:

A) Providing a carrier material for forming the carrier. The carrier material is electrically insulating. The carrier material has a high thermal conductivity. The carrier material has a ceramic material. Preferably, the carrier material has a ceramic based on $Al_2O_3$, LTCC or ZTA materials. Alternatively, the carrier material may also comprise AlN or $Si_3N_4$.

B) Applying a first upper electrode on a top side of the carrier material. The first electrode may be formed in a structured manner. The first electrode may fully cover the top side of the carrier. Alternatively, the first upper electrode covers only a partial area of the top side of the carrier, so that an edge area of the top side remains free of the first upper electrode.

Preferably, the first electrode is multi-layered. The first upper electrode is applied to the top side of the carrier material by a combined process of sputtering, chemical vapor deposition (CVD) process, physical vapor deposition (PVD) process, and/or electrodeposition.

In particular, the deposition of the multilayer first upper electrode is performed by a combination of different deposition processes to produce both thick and thin films. Additionally, a lithography process is required to pattern the metallization, as described above.

The resulting first upper electrode has a plurality of thick films and thin films of different materials. For example, the first upper electrode has Cu, Ni, Pd and/or Au.

C) Applying at least one second or lower electrode on a bottom side of the carrier material. The second electrode may be formed as a thin film or a thick film. For example, the second electrode is formed by sputtering. Alternatively, the second electrode may be deposited on the bottom side of the carrier material by a combined process of sputtering, CVD process, PVD process, and/or electrodeposition. In this case, the second electrode has a layered structure of different materials.

In particular, the deposition of the multilayer electrode is performed by a combination of different deposition processes to produce both thick and thin layers. In addition, a lithography process is required to pattern the electrode, as described above.

In a further step, a metallization can be applied to the bottom side of the second electrode. The metallization can be produced by a CVD process, a PVD process or by electrodeposition.

D) Arranging an NTC thermistor (chip NTC thermistor) on a partial area of the first upper electrode. The NTC thermistor is preferably soldered, Ag-sintered or bonded onto an edge region of the first upper electrode. That portion of the first upper electrode which remains free of the NTC thermistor acts as a first bond pad of the sensor element.

The chip NTC thermistor has a metallization on the top side. The metallization is preferably a thin film metallization. The metallization is preferably sputtered onto the top side of the NTC thermistor. The metallization forms a second upper electrode of the sensor element. The metallization acts as a second bond pad of the sensor element.

In the case of variant 2 with a chip NTC thermistor, it is possible to use a chip with a symmetrical structure, where on the bottom and top side the electrode has the same layers. Alternatively, however, it is also possible to use a chip that has an asymmetrical structure, whereby the layers of the electrodes on the bottom and top sides differ from one another. For example, the bottom side may have a nickel layer combined with a silver top layer, and the top side may have a nickel layer combined with a gold top layer. The advantage is that for joining on the carrier, the Ag layer provides better adhesion for silver pressure sintering and soldering. The thickness of the layers differs between the top and bottom sides. In one example, the bottom side has a 0.3 µm thick nickel layer covered with a 0.4 µm thick silver layer. On the top side, in this specific example, there is then a 1.1 µm thick nickel layer covered by a 0.2 µm thick gold layer. Of course, other variations in layer thickness and combinations of materials are possible.

Embodiments have the following aspects:

1. Sensor element (1) for measuring a temperature comprising
   a carrier (2), wherein the carrier (2) comprises an electrically insulating material and wherein the carrier (2) comprises a top side (2a) and a bottom side (2b),
   an NTC thermistor (3), wherein the NTC thermistor (3) is arranged on the top side (2a) of the carrier (2),
   at least two first electrodes (4) for electrically contacting the sensor element (1), the first electrodes (4) being arranged on the top side (2a) of the carrier (2),
   at least one second electrode (5) arranged on the bottom side (2b) of the carrier (2),
   wherein the sensor element (1) is designed to be integrated in an electrically insulating manner directly onto a conductor path of a power module.

2. Sensor element (1) according to aspect 1, wherein the electrically insulating material of the carrier (2) comprises a ceramic based on $Al_2O_3$, LTCC or ZTA materials.

3. Sensor element (1) according to aspect 1 or 2, wherein the coefficients of thermal expansion of the carrier material and a material of the NTC thermistor (3) are matched.

4. Sensor element (1) according to any one of the preceding aspects, wherein the respective first electrode (4) comprises a plurality of layers (10, 11, 12, 13), and wherein the respective first electrode (4) comprises Cu, Ni, Pd, and Au.

5. Sensor element (1) according to aspect 4, wherein at least one layer (10, 11) of the first electrode (4) is formed as a thick film, and wherein at least one further layer (12, 13) of the first electrode (4) is formed as a thin film.

6. Sensor element (1) according to any one of the preceding aspects, wherein the respective first electrode (4) has a first area (4a) for making electrical contact with the sensor element (1) by means of wire bonding or soldering, and wherein the respective first electrode (4) has a second area (4b) for contacting the NTC thermistor (3) by means of soldering.

7. Sensor element (1) according to aspect 6, wherein the first area (4a) and the second area (4b) are interconnected by a connecting area (4c).

8. Sensor element (1) according to any one of the preceding aspects,
   wherein the second electrode (5) is multi-layered and comprises the materials Cu, Ni, Pd and/or Au, or wherein the second electrode (5) comprises at least one layer of the material Ag.

9. Sensor element (1) according to any one of the preceding aspects, wherein the second electrode (5) is formed over the entire surface of the bottom side (2b) of the carrier (2).

10. Sensor element (1) according to any one of the preceding aspects, wherein the second electrode (5) is arranged such that a free edge (6) is formed on the bottom side (2b) of the carrier (2).

11. Sensor element (1) according to any one of the preceding aspects, wherein the second electrode (5) has a metallization (7) on the top side.

12. Sensor element (1) according to any one of the preceding aspects, further comprising at least one adhesion promoting layer (8), wherein the adhesion promoting layer (8) is formed between the respective first electrode (4) and the carrier (2) and/or between the second electrode (5) and the carrier (2).

13. Sensor element (1) according to any one of the preceding aspects, further comprising a protective layer (9), wherein the protective layer (9) is formed at least around the NTC thermistor (3).

14. Method for manufacturing a sensor element (1) comprising the following steps:
   A) Providing a carrier material for forming the carrier (2);
   B) Applying at least two first electrodes (4) to a top side (2a) of the carrier material;
   C) Applying at least one second electrode (5) to a bottom side (2b) of the carrier material;
   D) Arranging an NTC thermistor (3) on the top side (2a) of the carrier material, wherein the NTC thermistor (3) is soldered onto a partial area of the at least two first electrodes (4).

15. Method according to aspect 14, wherein the respective first electrode (4) has a multilayer structure and comprises the materials Cu, Ni, Pd and Au.

16. Method according to aspect 14 or 15, wherein the first electrodes (4) are deposited on the top side (2a) of the carrier material by a combined process of sputtering, CVD process, PVD process and/or electrodeposition.

17. Method according to any one of aspects 14 to 16, further comprising the step of:
   Forming a metallization (7) on the bottom side of the second electrode (5), wherein the metallization (7) is applied by a CVD process, a PVD process or by electrodeposition.

BRIEF DESCRIPTION OF THE DRAWINGS

The drawings described below are not to be understood as being to scale. Rather, individual dimensions may be enlarged, reduced or even distorted for better representation.

Elements that are similar to each other or that perform the same function are designated with the same reference signs.

DETAILED DESCRIPTION OF ILLUSTRATIVE EMBODIMENTS

Figure 1:
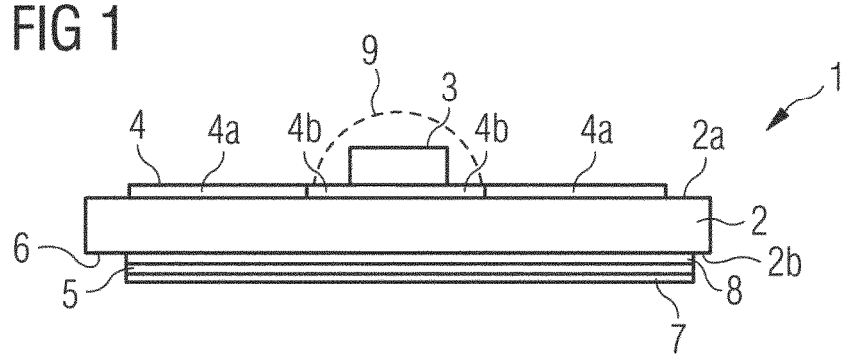
FIG. 1 shows a side view of a sensor element according to an embodiment.

FIG. 1 shows a sensor element 1 according to a first embodiment. The sensor element 1 is preferably designed to measure a temperature. The sensor element 1 is a temperature sensor. The sensor element 1 is designed to be processed with conventional AVT, such as soldering, silver sintering and/or wire bonding, which are standardly used in the power module manufacturing.

The sensor element 1 has a carrier 2. The carrier 2 has a good thermal conductive and electrically insulating material. Preferably, the carrier 2 is a ceramic carrier. Preferably, the carrier 2 has a ceramic based on $Al_2O_3$, LTCC or ZTA materials. Alternatively, the carrier may have AlN or $Si_3N_4$ as the carrier material.

The carrier 2 has a top side 2a and a bottom side 2b. The bottom side 2b is the side of the carrier 2 which faces a printed circuit board in the installed state of the sensor element 1.

The carrier 2 is rectangular. According to an embodiment, the carrier 2 has a width B (see FIG. 2), where 1.5 mm≤B≤2 mm. Preferably, the width B=1.6 mm. Of course, other (smaller or larger) widths are also conceivable, for example 0.5 mm≤B≤2 mm.

According to an embodiment, the carrier 2 has a thickness or height H (see FIG. 2), where 0.3 mm≤H≤0.5 mm. Preferably, the height H=0.4 mm. However, other (smaller or larger) heights are also conceivable, for example 0.1 mm≤H≤1.0 mm.

According to an embodiment, the carrier 2 has a length L (see FIG. 2), where 3.0 mm≤L≤4.0 mm. Preferably, the length L=3.5 mm. Smaller and larger embodiments are also conceivable, for example 1 mm≤L≤4 mm.

In other words, the sensor element 1 or the carrier 2 has very compact dimensions and is thus ideally suited for integration on a printed circuit board.

The sensor element 1 further comprises at least two first or upper electrodes 4 and at least one second or lower electrode 5. The second or lower electrode 5 is preferably a pure metallization and has no electrical function.

The at least two first electrodes 4 are formed on the top side 2a of the carrier 2. The first electrodes 4 are formed and arranged to enable electrical contacting of the sensor element 1 using conventional AVT (preferably wire bonding or soldering).

The respective first electrode 4 is formed in a structured manner. The respective first electrode 4 has, for example, the materials Cu, Ni, Pd and/or Au. The respective first electrode 4 has a multilayer structure (see FIG. 4). In particular, a bottom layer 10 of the first electrode 4 comprises Cu. The bottom layer 10 is the layer of the first electrode 4 which is formed directly or immediately on the top side 2a of the carrier 2. A first middle layer 11 of the first electrode 4 has Ni. The first middle layer 11 is directly adjacent to the bottom layer 10. A second middle layer 12 of the first electrode 4 has, for example, Pd. The second middle layer 12 is directly adjacent to the first middle layer 11. A top layer 13 of the first electrode 4 has Au. The top layer 13 is directly adjacent to the second middle layer 12. The top layer 13 forms the top side or outer side of the respective first electrode 4.

The layers 10, 11, 12, 13 are thin or thick films, depending on the material. The bottom layer 10 (Cu) and the first middle layer 11 (Ni) are preferably designed as thick films. The top layer 13 (Au) and the second middle layer 12 (Pd) are preferably thin films 12. The layer sequence and thickness are selected in such a way that, in particular, a reliable soldering and Al thick-wire bonding process is made possible.

The layer thicknesses vary from ≤1 μm to ≤20 μm, whereby the Cu and Ni layers 10, 11 designed as thick films can each be up to 20 μm thick. The Pd and Au layers 12, 13 each have a layer thickness of ≤1 μm.

The individual layers 10, 11, 12, 13 of the respective first electrode 4 are applied to the top side 2a of the carrier 2 by a combined process of sputtering, CVD process, PVD process and/or electrodeposition.

The two first electrodes 4 are arranged separately from each other. The electrodes 4 are configured in such a way that a free area is formed on the top side 2a, i.e. an area which is free of electrode material. In particular, the first electrodes 4 do not extend to the edge of the top side 2a.

The respective first electrode 4 has a first area (bond pad 4a) and a second area (solder pad 4b). The first area 4a is formed larger than the second area 4b. The first area 4a has an extension D1 parallel to a longitudinal axis L (see FIG. 2) of the sensor element 1, where 0.2 mm≤D1≤1.5 mm. Preferably, the extension D1=0.9 mm. The first area 4a has an extension D2 perpendicular to the longitudinal axis L of the sensor element 1, where 0.2 mm≤D2≤2.0 mm. Preferably, the extension D2=1.1 mm.

The two areas 4a, 4b merge into each other. In particular, the two areas 4a, 4b are linked or connected to each other by a web-shaped connecting area 4c.

Figure 2:
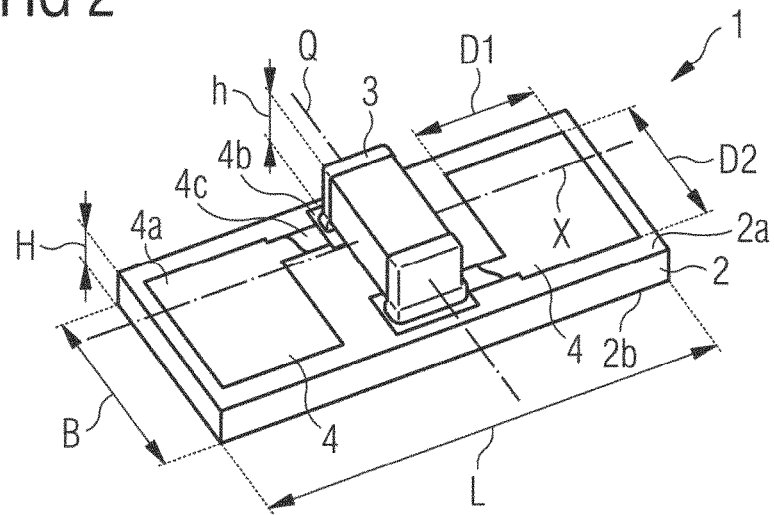
FIG. 2 shows a top perspective view of a sensor element according to a further embodiment.

The two first electrodes 4 are oriented on the top side 2a in such a way that the two second areas/solder pads 4b are arranged opposite one another along a transverse axis Q of the carrier 2, thereby enabling an NTC thermistor 3 to be soldered on. The transverse axis Q is perpendicular to the longitudinal axis L (FIG. 2). In particular, the second areas 4b are formed in a central area of the top side 2a.

Optionally, a solder resist can also be applied to both ridges of the electrode on the top side 2a of the carrier 2.

The sensor element 1 has the NTC thermistor 3 mentioned above. The NTC thermistor 3 in this embodiment is an SMD NTC thermistor. For simplicity, the term "NTC thermistor 3" will be used in the following in connection with the embodiment according to FIGS. 1 to 3 instead of "SMD NTC thermistor 3".

Alternatively (see embodiments according to FIGS. 5 and 6), the NTC thermistor 3 may also be a chip NTC thermistor 3. For simplicity, the term "NTC thermistor 3" is used instead of "chip NTC thermistor 3" in connection with the embodiment according to FIGS. 5 and 6.

Figure 6:
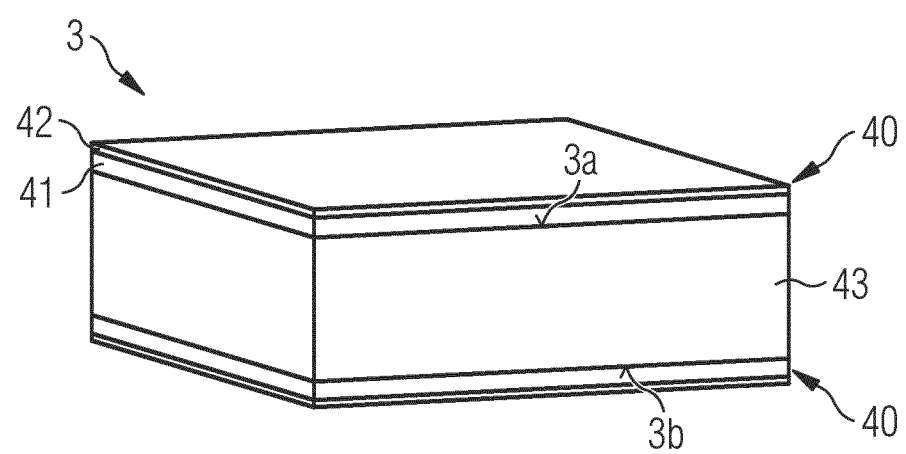
FIG. 6 shows a perspective view of a part of the sensor element (NTC chip thermistor) according to FIG. 5.

The NTC thermistor 3 has a top side 3a and a bottom side 3b (for this, see the embodiment according to FIG. 6). The NTC thermistor 3 has a height h of 0.2 mm≤h≤0.7 mm.

The NTC thermistor 3 is arranged on the surface of the sensor element 1. Preferably, the NTC thermistor 3 is an EIA 0402 or EIA 0201 SMD NTC. Alternatively, the NTC thermistor 3 may also be an EIA 01005 SMD NTC.

Preferably, the NTC thermistor 3 according to FIG. 1 (SMD NTC thermistor, variant 1) is soldered onto the top side 2a of the carrier 2. In particular, the NTC thermistor 3 is soldered onto the second areas 4b or solder pads 4b of the first electrodes 4. Consequently, the NTC thermistor 3 is arranged in the central area of the top side 2a of the carrier 2.

In order to avoid damage to the junctions between the NTC thermistor 3 and the carrier 2 due to cyclic temperature changes and thermomechanical stresses occurring in the process, the expansion coefficients of the carrier material and the ceramic material of the NTC thermistor 3 are matched to each other.

In the embodiment according to FIGS. 1 to 4, the sensor element 1 further has a protective layer or protective sheath 9 (glob top). The protective sheath 9 preferably completely encases at least the NTC thermistor 3. As a result, the NTC thermistor 3 is optimally protected against external influences.

Electrical contacting of the sensor element 1 is achieved by wire bonding (preferably Al thick wire bonding) of the first electrodes 4, in particular the first areas or bond pads 4a. Damage to the NTC ceramic can thus be avoided. The reliability of the sensor element 1 in contrast to prior art NTC thermistors is thus increased. The NTC thermistor 3 is also contacted by the wire bonding through the web-shaped connecting area 4c between the first area 4a and the second area 4b.

The second electrode 5 is disposed on the bottom side 2b of the carrier 2. The second electrode 5 is designed and arranged to be applied directly to the conductive path of a power module using conventional AVT (preferably soldering or silver sintering).

The second electrode 5 may be formed in multiple layers or in a single layer. For example, the second electrode 5 may have only one or more Ag layers (thin film electrode). Alternatively, the second electrode 5 can also have a layer structure analogous to the layer structure of the respective first electrode 4 (see also FIG. 4).

Preferably, the second electrode 5 is formed over the entire surface. In other words, the second electrode 5 extends completely or almost completely over the entire bottom side 2*b* of the carrier 2. However, a free edge 6 can also be formed on the bottom side 2*b*. In this case, the second electrode 5 does not extend to the edge of the bottom side 2*b* of the carrier 2.

A metallization 7, preferably an Ag metallization, is formed on the bottom side or outer side of the second electrode 5 in this embodiment. The metallization 7 can be formed via a CVD process, a PVD process or by electrodeposition onto the second electrode 5. The metallization 7 enables the direct connection of the sensor element 1 to the printed circuit board by using a silver sintering process. A metallization 7 is used in particular if the second electrode 5 has a layer structure analogous to the respective first electrode 4. If the second electrode 5 is designed as an Ag thin-film electrode, metallization 7 can also be omitted.

Furthermore, an adhesion promoting layer 8, for example a Ti layer, can be formed between the first electrode 4 and/or the second electrode 5 and the carrier 2. In this case, the electrode 4, 5 is formed directly on the adhesion promoting layer 8. This enables a particularly good bonding of the electrodes 4, 5 to the carrier 2.

According to a further embodiment, the sensor element 1 can also be formed without a second/lower electrode 5 in order to simplify the structure.

According to a further embodiment, the sensor element 1 may also be designed for thin wire bonding. In this example, the NTC thermistor 3 is preferably an SMD EIA 01005. Preferably, in this embodiment, the carrier 2 has the following dimensions: 0.1 mm≤H≤1 mm; 0.5 mm≤B≤2.0 mm; 1.0 mm≤L≤2.0 mm. Preferably, the first area 4*a* of the respective first electrode 4 has the following dimensions: 0.1 mm≤D1≤1.1 mm; 0.1 mm≤D2≤1.1 mm.

Compared to the prior art, the insulating sensor element 1 enables an application directly on the conductor path of a power module. Due to the special electrode structure, contacting with Al thick wire is possible without damaging the NTC ceramic as well as with increased reliability in contrast to prior art NTC thermistors. In addition, the mechanical stability of the sensor element 1 is increased by using ceramic carrier materials based on e.g. AlN, $Si_3N_4$, $Al_2O_3$, LTCC or ZTA materials.

Figure 3:
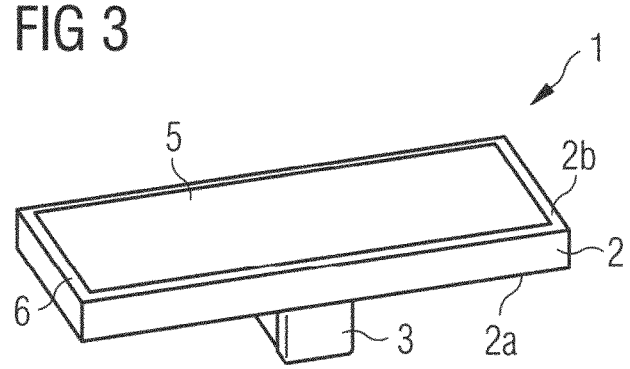
FIG. 3 shows a perspective bottom view of the sensor element according to FIG. 2.

FIGS. 2 and 3 show a perspective top view (FIG. 2) and a perspective bottom view (FIG. 3), respectively, of a sensor element 1 according to a further embodiment.

In contrast to the sensor element 1 according to FIG. 1, the sensor element here does not have a protective sheath 9. Furthermore, the sensor element 1 is designed without metallization 7 and without an adhesion promoting layer 8. For all further features of the sensor element 1, reference is made to the description in connection with FIG. 1.

In the following, a method for manufacturing a sensor element 1 is described. Preferably, the method produces the sensor element 1 according to one of the embodiments described above (FIGS. 1 to 3). All features described in connection with the sensor element 1 are therefore also applicable to the method and vice versa.

In a first step A), a carrier material is provided for forming the carrier 2. The carrier material exhibits good thermal conductivity. The carrier material has an electrically insulating material. The carrier material comprises a ceramic. Preferably, the carrier material comprises a ceramic based on $Al_2O_3$, LTCC or ZTA materials. Alternatively, the carrier material may also comprise AlN or $Si_3N_4$.

In a further step B), the deposition of the at least two first electrodes 4 on the top side 2*a* of the carrier material takes place. This is done by a combined process of sputtering, CVD process, PVD process and/or electrodeposition. In this process, multi-layered first electrodes 4 are formed. In particular, the respective first electrode 4 has a layered structure consisting of a bottom layer 10, two middle layers 11, 12 and a top layer 13.

First, the bottom layer 10 is deposited on the top side 2*a* of the substrate, for example by electroplating. Preferably, the bottom layer 10 comprises Cu. Preferably, the bottom layer 10 is a thick film. Preferably, the bottom layer 10 has a thickness between 1 µm and 20 µm, particularly preferably between 3 µm and 15 µm.

Subsequently, the first middle layer 11 is formed on the bottom layer 10, for example by electroplating. The first middle layer 11 has Ni. Preferably, the first middle layer 11 is a thick film. Preferably, the first middle layer 11 has a thickness between 1 µm and 20 µm, particularly preferably between 3 µm and 7 µm.

Subsequently, the second middle layer 12 is formed on the first middle layer 11, for example by means of sputtering. The second middle layer 12 has, for example, Pd. Preferably, the second middle layer 12 is a thin film. Preferably, the second middle layer 12 has a thickness of ≤1 µm.

Last, the top layer 13 is formed on the second middle layer 12, for example by sputtering. The top layer 13 has Au. The top layer 13 forms the top side or outer side of the respective first electrode 4. Preferably, the top layer 13 is a thin film. Preferably, the top layer 13 has a thickness of ≤1 µm.

In an alternative embodiment, a further step takes place prior to step B), in which the adhesion promoting layer 8 is applied to the top side 2*a* of the carrier material. Subsequently, in this embodiment, the first electrodes 4 are formed on the adhesion promoting layer 8.

In a further step C), the second electrode 5 is applied to the bottom side 2*b* of the carrier material. This can also be done by a combined process of sputtering, CVD process, PVD process and/or electrodeposition. The resulting second electrode 5 has a multilayer structure, for example analogous to the structure of the respective first electrode 4.

Alternatively, however, the second electrode 5 may have only one or more layers of Ag. In this case, the second electrode 5 is applied to the bottom side 2*a* of the carrier material.

In an alternative embodiment, a further step in which the adhesion promoting layer 8 is applied to the bottom side 2*b* of the carrier material takes place before step C). Subsequently, in this embodiment, the second electrode 5 is formed on the adhesion promoting layer 8.

In an alternative embodiment, step C) may be omitted so that no second electrode 5 is deposited on the bottom side 2*b* of the carrier material.

In an alternative further step, a metallization 7 may be formed on the bottom side or outer surface of the second electrode 5. The metallization is applied to the second electrode 5 via a CVD process, a PVD process or by electrodeposition.

In a next step D), the arrangement of the NTC thermistor 3 on the top side 2a of the carrier material takes place. In particular, the NTC thermistor 3 is soldered onto a partial area (second area 4b or solder pad 4b) of the at least two first electrodes 4.

In a further step, a protective layer or protective sheath 9 is applied. The protective sheath 9 preferably comprises a polymer. Preferably, the protective sheath 9 consists of a polymer. The protective sheath 9 preferably completely encases the NTC thermistor 3.

Subsequently, the direct bonding of the sensor element 1 to a conductor path of a printed circuit board can take place, in particular by means of a conventional AVT, preferably by soldering or Ag-sintering of the second electrode 5.

Furthermore, the first electrodes 4 and the NTC thermistor 3 can now be contacted. This is also done by means of a conventional AVT, preferably by wire bonding (preferably Al thick wire bonding) or soldering.

Figure 5:
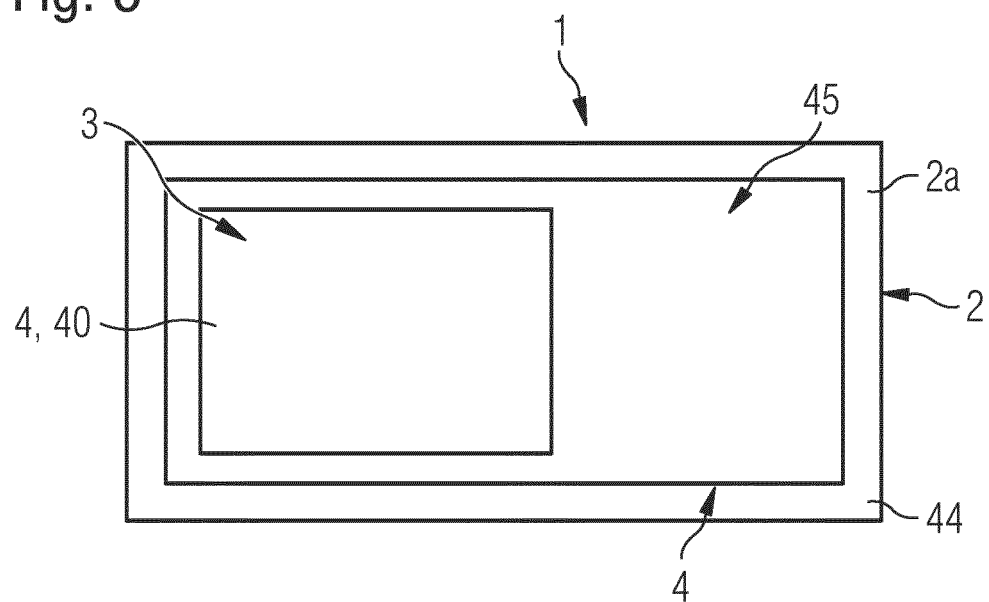
FIG. 5 shows a top view of a sensor element according to a further embodiment.

FIG. 5 shows a sensor element 1 according to a further embodiment. In contrast to the embodiments shown in FIGS. 1 to 3, the NTC thermistor 3 here is a chip NTC thermistor. Furthermore, in contrast to the embodiments shown in FIGS. 1 to 3, only one electrode 4 is formed here directly on the top side 2a of the carrier 2. In the following, this electrode will be referred to as the first upper electrode 4. The first upper electrode 4 is constructed analogously to the first electrodes 4 described above. In particular, the first upper electrode has a multilayer structure.

The first upper electrode 4 is applied to the top side 2a of the carrier in such a way that an edge region of the carrier 2 is free of the first upper electrode 4 (free edge 44). The free edge 44 has a width of 0.05 to 0.25 mm.

Alternatively, however, the first upper electrode 4 may completely cover the top side 2a of the carrier 2 (not explicitly shown). In this case, an area of the first upper electrode 4 is (1.25±0.75) mm×(2.25±1.25) mm.

The NTC thermistor 3 does not completely cover the first upper electrode 4. As can be seen from FIG. 5, the NTC thermistor 3 is arranged in an edge region of the first upper electrode 4. In other words, a partial area 45 of the first upper electrode 4 is free of the NTC thermistor 3. This partial area 45 serves as a first bond pad.

The NTC thermistor 3 has a metallization 40. The metallization 40 is a thin film metallization. The metallization 40 is formed on the top side 3a of the NTC thermistor 3, preferably sputtered on. A further metallization 40 can be arranged on a further, opposite side of the NTC thermistor (bottom side 3b) (FIG. 6).

The metallization 40 on the top side 3a of the NTC thermistor 3 serves as a further bonding pad for an Al-thick wire contacting of the sensor element 1. In other words, the metallization 40 of the NTC thermistor 3 functions as a second upper electrode 4. This ensures an electrical contacting of the sensor element 1 in a simple way.

The metallization 40 is a layered electrode with several layers 41, 42 (FIG. 6). The layers 41, 42 are sputtered, for example. The metallization 40 has a layer 41 which is applied directly to the ceramic of the base body 43 (FIG. 6). The layer 41 contains nickel, for example with a proportion of vanadium, or consists of these metals.

The layer 41 can again be formed in multiple layers (not explicitly shown). A bottom layer of the layer 41 is, for example, in direct contact with the ceramic. The bottom layer includes, for example, chromium or consists of chromium. The layer 41 may further comprise a top layer deposited on the bottom layer. The top layer contains, for example, nickel with a portion of vanadium or consists of these metals.

The layer 41 has, for example, a thickness in the range of 0.2 μm to 10 μm. Preferably, the thickness is in the range of 0.3 μm to 2 μm. This thickness can apply to both a single-layer and a multilayer layer 41.

A further layer 42 (top layer) is applied to the layer 41. For example, the top layer 42 serves as corrosion protection for the layer 41, in particular to prevent oxidation. The top layer contains, for example, silver, gold, copper or aluminium or consists of one of these materials. The top layer has, for example, a thickness in the range from 0.05 μm to 20 μm.

All further features of the sensor element 1, in particular the second or lower electrode 5, the metallization 7 and the adhesion promoting layer 8 are implemented analogously to the embodiments described further above.

In the following, a method for manufacturing a sensor element 1 according to the embodiment of FIGS. 5 and 6 is described.

In a first step A), a carrier material for forming the carrier 2 is provided. The carrier material exhibits good thermal conductivity. The carrier material exhibits an electrically insulating material. The carrier material comprises a ceramic. Preferably, the carrier material has a ceramic based on AlN, $Si_3N_4$, $Al_2O_3$, LTCC or ZTA materials.

Figure 4:
FIG. 4 shows a schematic representation of the layer structure of a first electrode.

In a further step B), the deposition of one of the two first electrodes 4 (first upper electrode 4) on the top side 2a of the carrier material takes place. This is done by a combined process of sputtering, CVD process, PVD process and/or electrodeposition. In this process, a multilayer first upper electrode 4 is formed. In particular, the first upper electrode 4 has a layered structure consisting of a bottom layer 10, two middle layers 11, 12 and a top layer 13 (FIG. 4). The layer structure of the first upper electrode 4 is analogous to the layer structure of the first electrodes described above.

The first upper electrode 4 can be applied over the entire surface of the top side 2a. Alternatively, the first upper electrode 4 is applied in such a way that an edge region of the carrier 2 remains free (free edge 44).

In an alternative embodiment, a further step in which the adhesion promoting layer 8 is applied to the top side 2a of the carrier material takes place before step B). Subsequently, in this embodiment, the first upper electrode 4 is formed on the adhesion promoting layer 8.

In a further step C), the second or lower electrode 5 is applied to the bottom side 2b of the carrier material. This can also be done by a combined process of sputtering, CVD process, PVD process and/or electrodeposition. The resulting second electrode 5 has a multilayer structure, for example analogous to the structure of the respective first electrode 4. Alternatively, however, the second electrode 5 may have only one or more layers Ag.

In an alternative embodiment, a further step takes place prior to step C), in which the adhesion promoting layer 8 is applied to the bottom side 2b of the carrier material. Subsequently, in this embodiment, the second electrode 5 is formed on the adhesion promoting layer 8.

In an alternative further step, a metallization 7 can be formed on the bottom side or outer surface of the second electrode 5. The metallization is applied to the second electrode 5 via a CVD process, a PVD process or by electrodeposition.

In an alternative embodiment, the application of the second electrode 5 to the bottom side 2b of the substrate is omitted. In this case, the sensor element 1 is bonded by means of adhesive bonding.

In a next step D), the NTC thermistor 3 is arranged on a partial area of the first upper electrode 4. In particular, the NTC thermistor 3 is soldered onto an edge area of the first upper electrode 4. The NTC thermistor 3 has a metallization 40 on the top side 3a, which functions as the second upper electrode 4.

Subsequently, the direct bonding of the sensor element 1 to a conductor path of a printed circuit board can take place, in particular by means of a conventional AVT, preferably by soldering or Ag-sintering of the second electrode 5.

Furthermore, the first or upper electrodes 4, 40 can now be contacted. This is also done by means of a conventional AVT, preferably by wire bonding (preferably Al thick wire bonding) or soldering.

The description of the objects disclosed herein is not limited to the individual specific embodiments. Rather, the features of the individual embodiments may be combined with one another in any desired manner—to the extent that this is technically feasible.

The invention claimed is:

1. A sensor element comprising:
   a carrier comprising an electrically insulating material, a top side and a bottom side;
   an NTC thermistor arranged on the top side of the carrier;
   at least two first electrodes arranged on the top side of the carrier,
   wherein a respective one of the first electrodes comprises a first area configured for electrically contacting the sensor element by a wire bonding or soldering,
   wherein the respective one comprises a second area configured for electrically contacting the NTC thermistor by soldering,
   wherein the first area and the second area are interconnected by a web-shaped connecting area;
   at least one second electrode arranged over an entire surface on the bottom side of the carrier,
   wherein the second electrode is directly applicable to a conductor path of a power module using conventional assembly and connection technology; and
   a protective layer arranged at least around the NTC thermistor,
   wherein the protective layer completely envelops the NTC thermistor and comprises a polymer,
   wherein the NTC thermistor is an SMD NTC thermistor,
   wherein the sensor element is configured for direct integration in an electrically insulating manner, and
   wherein the sensor element is configured to measure a temperature.

2. The sensor element according to claim 1, wherein the sensor element is configured for the direct integration onto the conductor path of the power module in the electrically insulating manner.

3. The sensor element according to claim 1, wherein the electrically insulating material of the carrier comprises a ceramic based on AlN, Si$_3$N$_4$, Al$_2$O$_3$, low temperature cofired ceramics (LTCC) or Zirconia Toughened Aluminum Oxide (ZTA) materials.

4. The sensor element according to claim 1, wherein coefficients of thermal expansion of a carrier material and a material of the NTC thermistor are matched.

5. The sensor element according to claim 1, wherein the respective one comprises a plurality of layers, and wherein the respective one comprises Cu, Ni, Pd and/or Au.

6. The sensor element according to claim 5, wherein at least one layer of the respective one is a thick film, and wherein at least one further layer of the respective one is a thin film.

7. The sensor element according to claim 1, wherein the respective one is arranged directly on the top side of the carrier, wherein the NTC thermistor is arranged directly on the respective one, wherein the NTC thermistor has a metallization located on a top side of the NTC thermistor, and wherein the metallization forms another one of the two first electrodes.

8. The sensor element according to claim 7, wherein the NTC thermistor is a chip NTC thermistor.

9. The sensor element according to claim 7, wherein the metallization is configured for electrically contacting of the sensor element by wire bonding.

10. The sensor element according to claim 7, wherein the metallization has at least one layer containing nickel.

11. The sensor element according to claim 10, wherein the layer is arranged directly at a ceramic base body of the NTC thermistor.

12. The sensor element according to claim 10, wherein the layer further comprises a proportion of vanadium.

13. The sensor element according to claim 7, wherein the metallization comprises a plurality of layers arranged directly one above the other.

14. The sensor element according to claim 1, wherein the second electrode is multi-layered and comprises Cu, Ni, Pd and/or Au, or wherein the second electrode comprises at least one layer of Ag.

15. The sensor element according to claim 14, wherein the second electrode is arranged such that a free edge is formed on the bottom side of the carrier.

16. The sensor element according to claim 14, wherein the second electrode has a metallization on a top side.

17. The sensor element according to claim 14, further comprising at least one adhesion promoting layer arranged between the respective one and the carrier and/or between the second electrode and the carrier.

18. A method for manufacturing the sensor element according to claim 1, the method comprising:
    providing a carrier material for forming the carrier;
    applying the at least two first electrodes to a top side of the carrier material;
    applying the at least one second electrode to the bottom side of the carrier material; and
    arranging the NTC thermistor on the top side of the carrier material after applying the two first electrodes,
    wherein the respective first electrode has a multilayer structure and comprises Cu, Ni, Pd and/or Au,
    wherein a bottom layer of the respective first electrode comprises Cu,
    wherein the bottom layer is a layer of the respective first electrode that is formed directly on the top side of the carrier, and
    wherein the NTC thermistor is soldered onto a partial area of the at least two first electrodes.

19. The method according to claim 18, wherein the first electrodes are applied to the top side of the carrier material by a combined process of sputtering, CVD process, PVD process and/or electrodeposition.

20. The method according to claim 18, further comprising forming a metallization on the bottom side of the second electrode, wherein the metallization is applied by a CVD process, a PVD process and/or by electrodeposition.

21. A method for manufacturing the sensor element according to claim 1, the method comprising:
    providing a carrier material for forming the carrier;
    applying at least a first electrode on a top side of the carrier material;

applying the at least one second electrode to the bottom side of the carrier material; and arranging the NTC thermistor on the first electrode, wherein the NTC thermistor is applied to a partial area of the first electrode, and wherein the NTC thermistor has a metallization which functions as a further first electrode, wherein the NTC thermistor is a chip NTC thermistor.

22. The sensor element according to claim 1, wherein the second electrode comprises at least one layer of Ag.

23. A sensor element comprising:

a carrier comprising an electrically insulating material, a top side and a bottom side;

an NTC thermistor arranged on the top side of the carrier; and at least two first electrodes arranged on the top side of the carrier, wherein one of the first electrodes is arranged directly on the top side of the carrier, wherein the NTC thermistor is arranged directly on a respective one of the first electrodes, wherein the NTC thermistor has a metallization located on a top side of the NTC thermistor, wherein the metallization forms another one of the two first electrodes, wherein the respective one of the first electrodes covers an entire top surface of the carrier, wherein the sensor element is configured for direct integration in an electrically insulating manner, and wherein the sensor element is configured to measure a temperature.

\* \* \* \* \*